(12) United States Patent
Winkler et al.

(10) Patent No.: US 8,563,927 B2
(45) Date of Patent: Oct. 22, 2013

(54) SHIELDING MEMBER HAVING A CHARGE CONTROL ELECTRODE, AND A CHARGED PARTICLE BEAM APPARATUS

(75) Inventors: Dieter Winkler, München (DE); Stefan Lanio, Erding (DE)

(73) Assignee: ICT Integrated Circuit Testing Gesellschaft fur Halbleiterpruftechnik mbH, Heimstetten (DE)

( * ) Notice: Subject to any disclaimer, the term of this patent is extended or adjusted under 35 U.S.C. 154(b) by 105 days.

(21) Appl. No.: 13/196,778

(22) Filed: Aug. 2, 2011

(65) Prior Publication Data

US 2013/0026385 A1 Jan. 31, 2013

(30) Foreign Application Priority Data

Jul. 26, 2011 (EP) .................................... 11175427

(51) Int. Cl.
*G21K 7/00* (2006.01)
*G01N 23/04* (2006.01)

(52) U.S. Cl.
USPC ..... 250/310; 250/396 R; 250/398; 250/492.2; 250/311

(58) Field of Classification Search
USPC ............... 250/396 R, 310, 442.11, 309, 398, 250/492.1, 396 ML; 850/9
See application file for complete search history.

(56) References Cited

U.S. PATENT DOCUMENTS

| | | | | |
|---|---|---|---|---|
| 6,770,402 | B2* | 8/2004 | Suguro et al. | 430/5 |
| 6,777,675 | B2* | 8/2004 | Parker et al. | 850/9 |
| 7,220,973 | B2* | 5/2007 | Yu et al. | 250/442.11 |
| 7,928,383 | B2* | 4/2011 | Wang et al. | 250/310 |
| 2003/0085360 | A1* | 5/2003 | Parker et al. | 250/396 R |
| 2004/0119021 | A1* | 6/2004 | Parker et al. | 250/396 R |
| 2005/0001178 | A1* | 1/2005 | Parker et al. | 250/494.1 |
| 2007/0187598 | A1* | 8/2007 | Tachibana et al. | 250/310 |
| 2012/0145900 | A1* | 6/2012 | Chen et al. | 250/311 |

FOREIGN PATENT DOCUMENTS

EP 1587128 A1 10/2005

OTHER PUBLICATIONS

European Search Report for Application No. 11175427.1-2208 dated Dec. 20, 2011.

* cited by examiner

*Primary Examiner* — Nikita Wells
*Assistant Examiner* — Johnnie L Smith
(74) *Attorney, Agent, or Firm* — Patterson & Sheridan, LLP

(57) ABSTRACT

A shielding member for a charged particle beam apparatus includes a conductive substrate; and a through hole extending through the conductive substrate. The conductive substrate is comprised of a material having a specific electrical resistivity in a range from about $10^6$ Ωcm to about $10^{12}$ Ωcm.

20 Claims, 6 Drawing Sheets

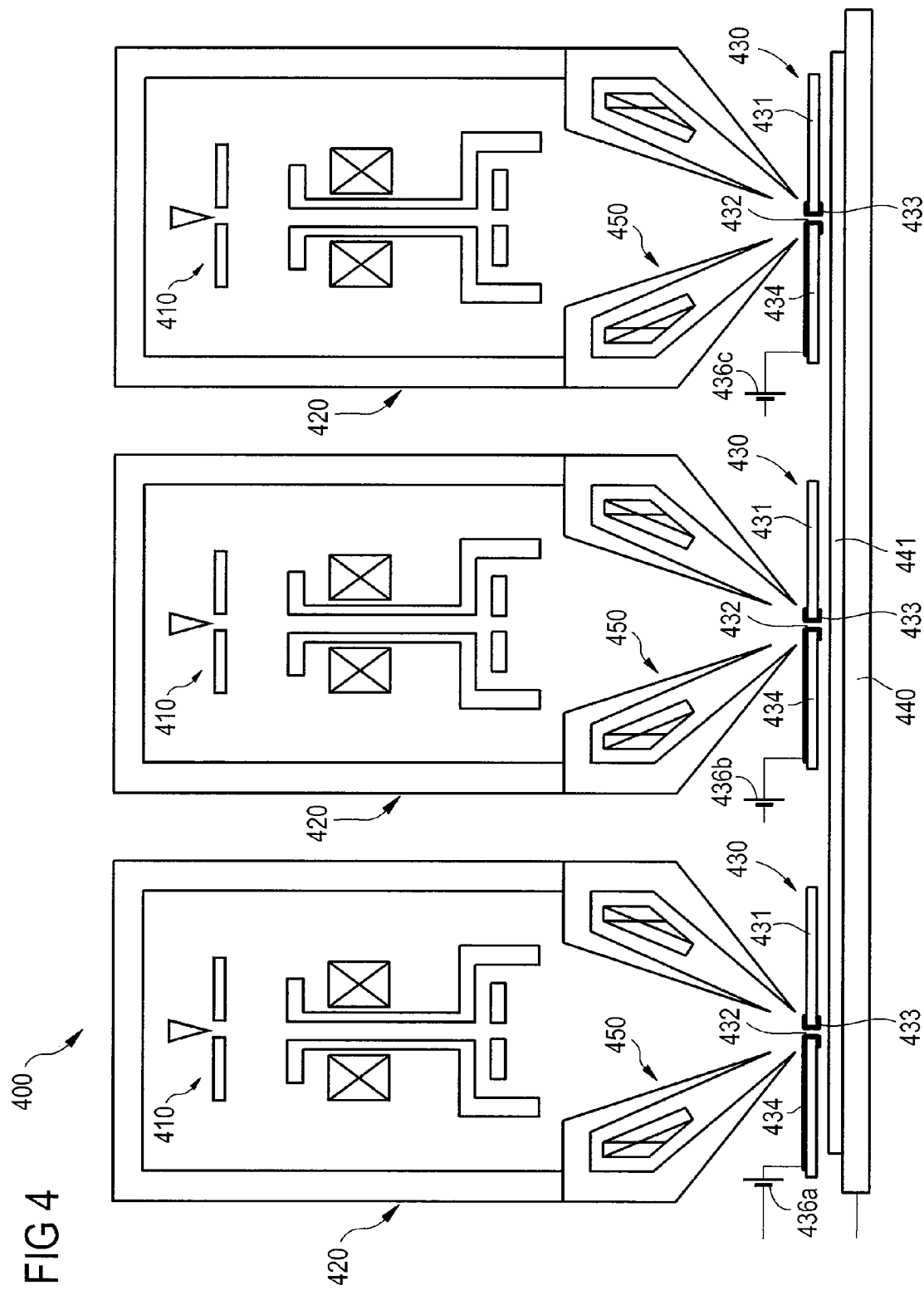

SHIELDING MEMBER HAVING A CHARGE CONTROL ELECTRODE, AND A CHARGED PARTICLE BEAM APPARATUS

FIELD OF THE INVENTION

Embodiments of the invention relate to a shielding member for a charged particle beam apparatus. Further embodiments relates to shielding apparatuses having a plurality of shielding members. Further embodiments relates to charged particle beam apparatuses having a shielding member or a shielding apparatus.

BACKGROUND OF THE INVENTION

During manufacturing of semiconductor devices or the like, a plurality of observation steps and sample modification steps are usually conducted. Common systems include an electron beam column for observation, imaging, testing or inspecting of a specimen such as DR, CD or inspection tools which use an intermediate beam acceleration to reduce the particle beam diameter.

For example, in a focused electron beam system with intermediate acceleration the electron beam is emitted with comparably high energy. It runs through the column at this high energy and is slowed down to the required landing energy by a sample or specimen, which is negatively biased in case of electrons.

The sample or specimen thus has to be protected against arcing to ground, which may destroy it. Typically, a metal plate is inserted between the grounded column and the specimen. It has a hole to permit the primary beam and the emitted secondary electrons to pass through the metal plate. The electric field is thus confined between this metal plate and the column. However, this means that arcing between the metal plate and the column cannot be excluded. If arcing occurs, the metal plate changes to ground potential and the specimen becomes exposed to an electrical field. As a consequence, arcing between the metal plate and the specimen may occur, which can destroy the specimen.

In view of the above, there is a desire to improve protection of the specimen.

SUMMARY

In light of the above, a shielding member for a charged particle beam apparatus according to claim 1, a shielding apparatus for a charged particle beam apparatus according to claim 10, a charged particle beam apparatus according to claim 11, a method of manufacturing a shielding member according to claim 14, and a method of operating a charged particle beam apparatus according to claim 15 are provided.

According to one embodiment, a shielding member for a charged particle beam apparatus is provided. The shielding member includes a conductive substrate comprised of a material having a specific electrical resistivity in a range from about $10^6$ Ωcm to about $10^{12}$ Ωcm, and a through hole extending through the conductive substrate.

According to another embodiment a shielding apparatus for a charged particle beam apparatus is provided. The shielding apparatus includes a plurality of shielding members, wherein each shielding member is insulated from adjacent shielding members and includes a separate electrical connection for connecting the conductive substrate with a voltage supply.

According to a yet further embodiment, a charged particle beam apparatus, particularly a focused charged particle beam apparatus is provided. The charged particle beam apparatus includes at least one emitter for emitting charged particles; at least one column for guiding the charged particles emitted from the emitter; a stage adapted to hold a specimen, wherein the column is arranged between the stage and the emitter; and at least one shielding member arranged between the stage and the column. The conductive substrate of the shielding member is connected with a voltage supply. The shielding member is positioned to allow charged particles guided through the column to pass through the through hole and to reach a specimen held by the stage, wherein the shielding member is electrically insulated from the column.

According to an even further embodiment, a method of manufacturing a shielding member is provided. The method includes providing a conductive substrate comprised of a material having a specific electrical resistivity in a range from about $10^6$ Ωcm to about $10^{12}$ Ωcm; and forming a through hole in the conductive substrate so that the through hole extends through the conductive substrate.

According to yet a further embodiment, a method of operating a charged particle beam apparatus is provided. The method includes placing a specimen on a stage of a charged particle beam apparatus; emitting a charged particle beam from an emitter of the charged particle beam apparatus and guiding the emitted charged particle beam through a column of the charged particle beam apparatus; biasing a shielding member arranged between the specimen and the column to retard the charged particles passing through the column; and repeatedly switching the electrode of the shielding member.

Further advantages, features, aspects and details that can be combined with embodiments described herein are evident from the depending claims, the description and the drawings.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following:

FIG. 4 illustrates a schematic view of a multi-column charged particle beam apparatus with a shielding apparatus according to embodiments described herein.

DETAILED DESCRIPTION OF THE INVENTION

Figure 1:
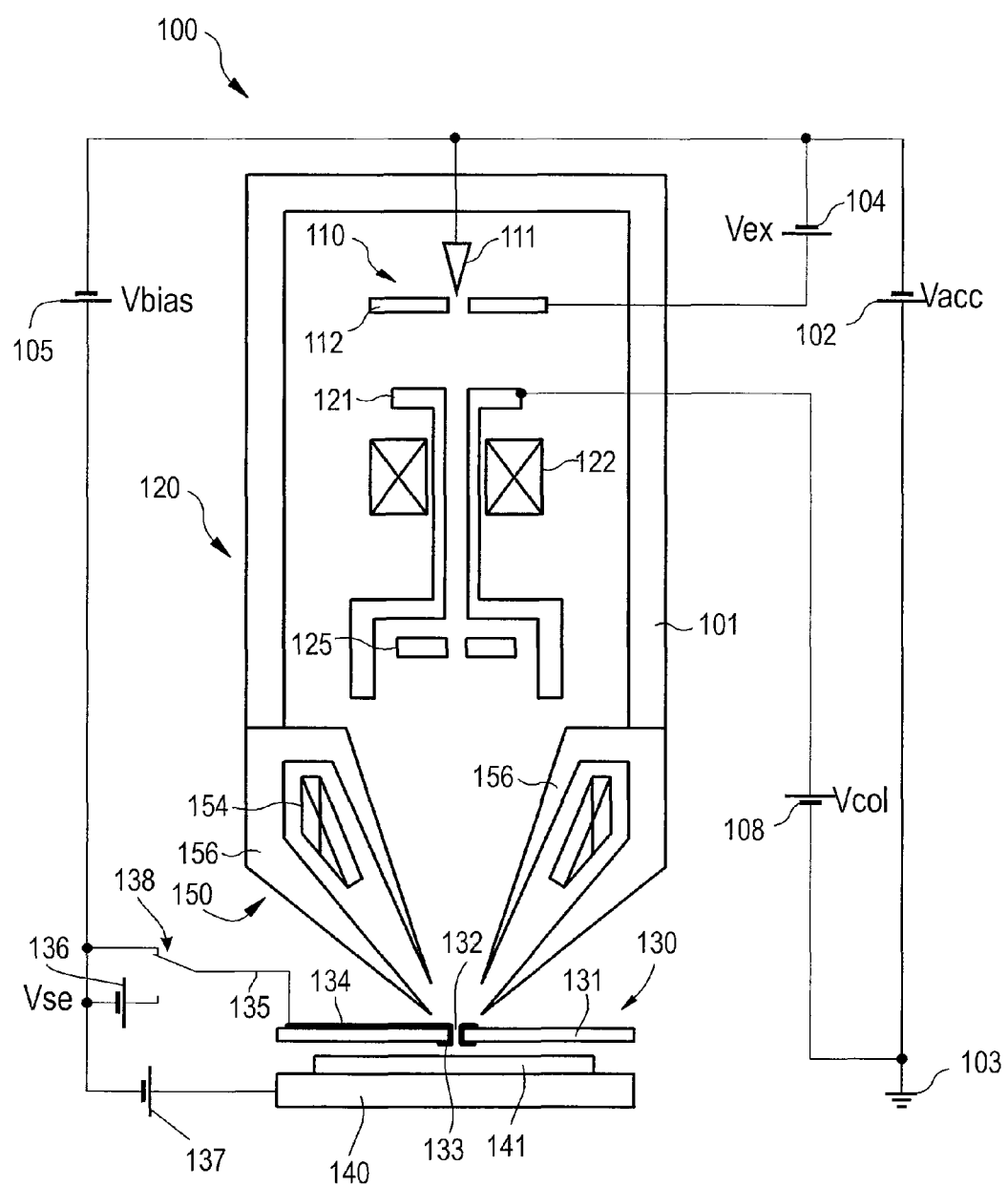
FIG. 1 illustrates a schematic view of a charged particle beam device with a shielding member according to embodiments described herein.

Reference will now be made in detail to the various embodiments of the invention, one or more examples of which are illustrated in the figures. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

Without limiting the scope of protection of the present application, in the following the charged particle beam apparatus or components thereof will exemplarily be referred to as a charged particle beam apparatus capable of detecting secondary electrons. The present invention can still be applied for apparatuses and components detecting corpuscles such as secondary and/or backscattered charged particles in the form of electrons or ions, photons, X-rays or other signals in order to obtain a specimen image. According to an embodiment, which can be combined with other embodiments described herein, the charged particle beam apparatus is a scanning electron microscope with one or multiple columns.

Within the following description of the drawings, the same reference numbers refer to the same components. Generally, only the differences with respect to the individual embodiments are described.

A "specimen" as referred to herein, includes, but is not limited to, semiconductor wafers, semiconductor workpieces, and other workpieces such as masks, glass substrates, memory disks or the like.

In the context of this application, without limiting the scope of protection of the present application, an intermediate beam acceleration system intends to describe a charged particle beam apparatus with initial high acceleration of the charged particles which will be decelerated to a landing energy shortly before striking the specimen. The energy or velocity ratio $v_{ac}/v_{landing}$ between the acceleration velocity $v_{ac}$ at which the charged particles are guided through the column and the landing velocity $v_{landing}$ at which the charged particles strikes the specimen can be about at least 5 or higher. Furthermore, the landing energy can be 2 kV or less. These are approximate values which might be adapted according to circumstances.

According to embodiments described herein, a charged particle beam apparatus is a focused charged particle beam apparatus where the charged particles emitted from the tip are finally focused onto the specimen.

According to embodiments described herein, which can be combined with other embodiments described herein, the charged particle beam apparatus is an electron beam apparatus such as a focused electron beam apparatus.

According to embodiments described herein, which can be combined with other embodiments, the charged particle beam apparatus is an intermediate beam acceleration system with a velocity ratio $v_{ac}/v_{landing}$ of about at least 5 or higher.

According to embodiments described herein, a shielding member 130 for a charged particle beam apparatus is provided. FIG. 1 illustrates a charged particle beam apparatus 100 having such a shielding member 130. Charged particle beam apparatus 100 is in the present embodiment, without being limited thereto, an electron beam apparatus. The shielding member 130 includes a conductive ceramic body 131 which can be comprised of, for example, SiC or other suitable conductive ceramic materials such as doped aluminum oxide. Conductive ceramic body 131 forms in this embodiment a conductive substrate of the shielding member 130.

Figure 2A:
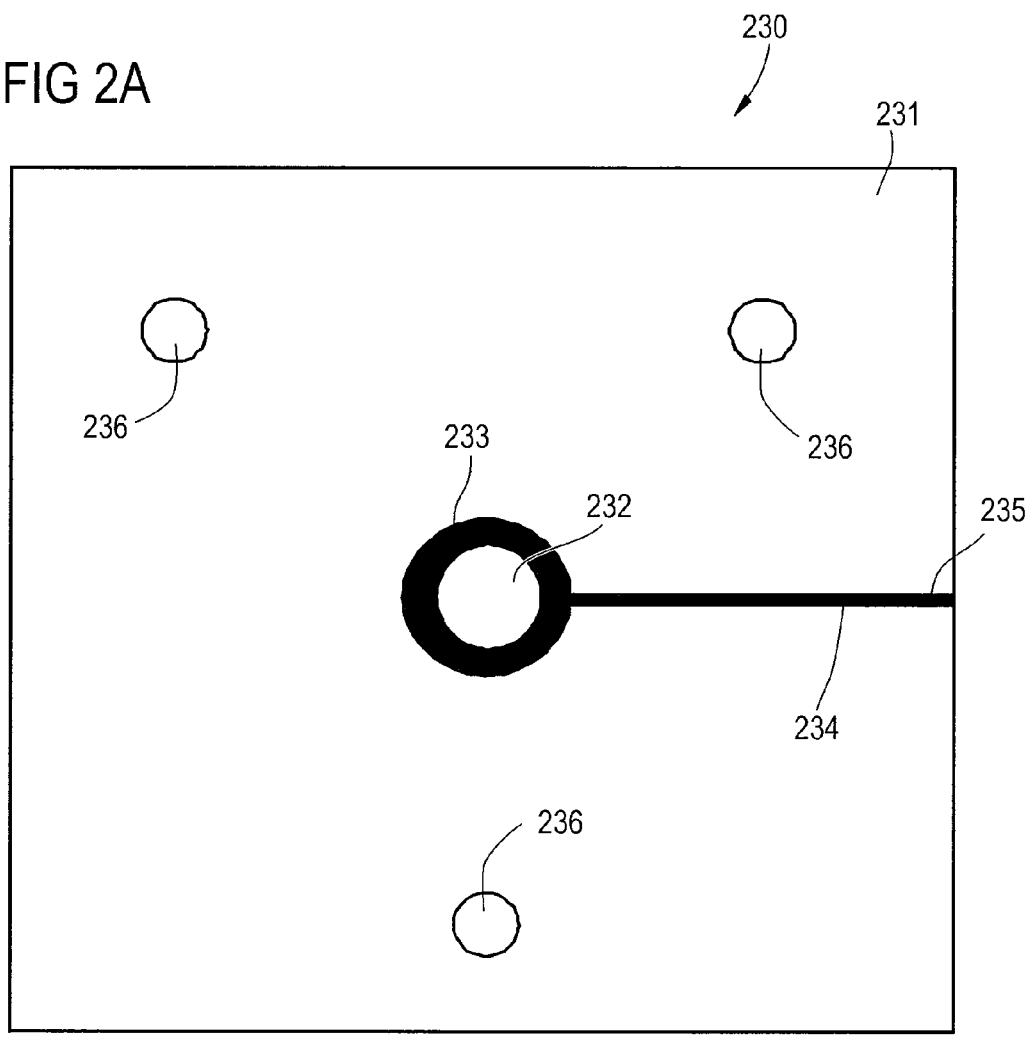
FIG. 2A illustrates a schematic view of a shielding member according to embodiments described herein.
Figure 2B:
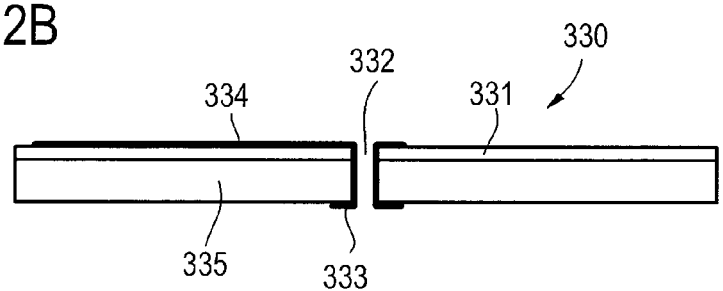
FIG. 2B illustrates a schematic view of a shielding member according to embodiments described herein.

A through hole 132 extends through the ceramic body 131. The through hole 132 can have a diameter of about 0.5 mm to about 10 mm, particularly between 1 mm and 5 mm. The through hole 132 is adapted to allow charged particles to pass therethrough. This will be explained in more detail further below. One or more voltage supplies, as will be described further below in detail, supply a voltage selected such to bias the shielding member 130. In a further embodiment, an electrode 133 surrounds the through hole 132 as illustrated in FIGS. 2A and 2B. Electrode 133 is arranged in the embodiment illustrated in FIG. 1 on the surface of the ceramic body 131 which faces, when in use, the specimen. In further embodiments, electrode 133 is arranged on the opposite surface of ceramic body 131. The function of electrode 133 will be described in detail further below.

In this embodiment, the shielding member 130 includes furthermore an electrical connection for connecting the electrode 133 and the conductive ceramic body 131 with one or more voltage supplies. One voltage supply, as will be described further below in detail, supplies a voltage selected such to bias the shielding member 130 and, if available, the electrode 133. The further voltage supply 136 is adapted to provide a switching voltage $V_{SE}$ as described in detail further below. The electrode 133 has a lower specific electrical resistivity than the ceramic body 131. This allows for fast switching of the electrode.

Figure 3:
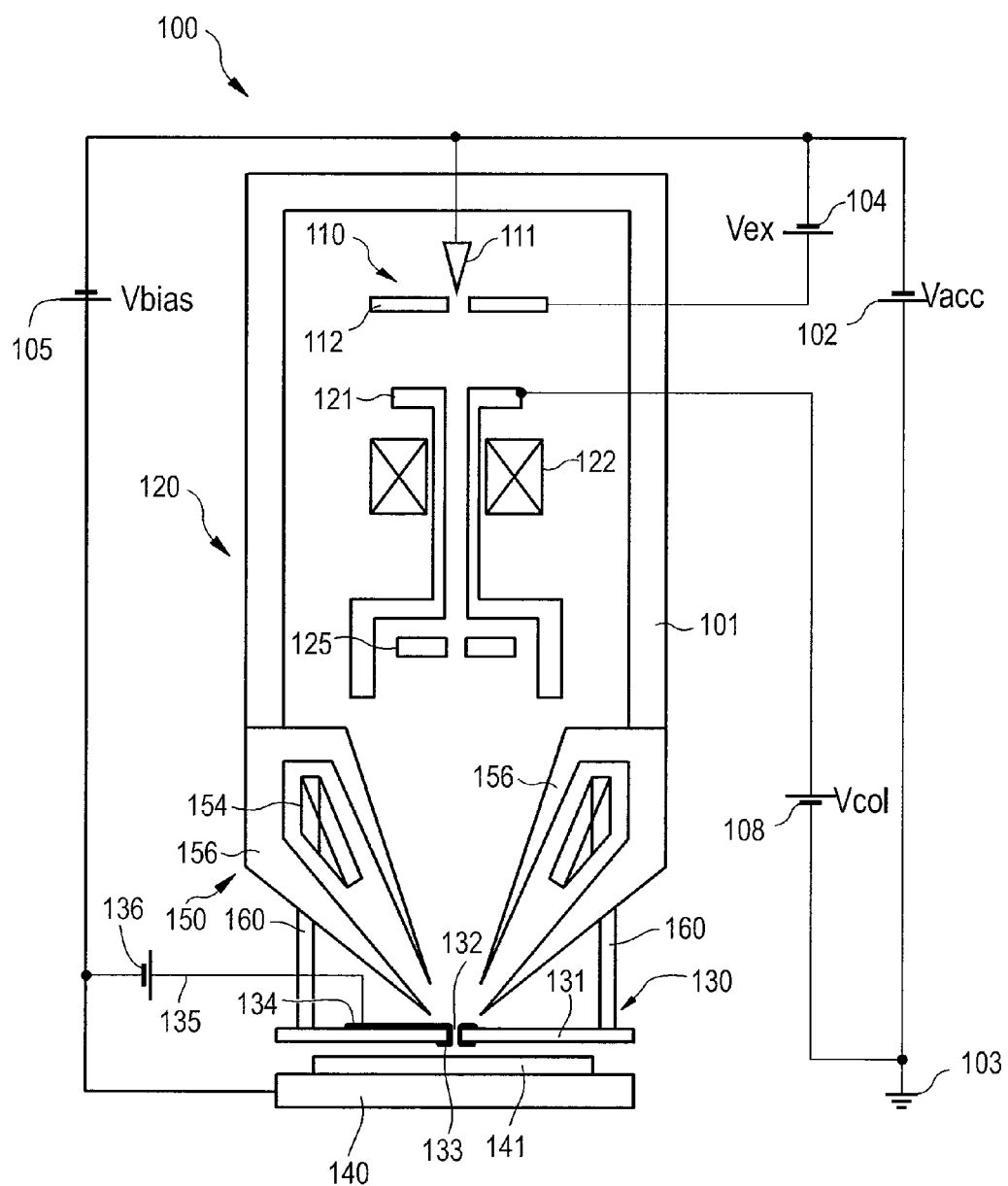
FIG. 3 illustrates a schematic view of a charged particle beam apparatus with a shielding member according to embodiments described herein.

Electrode 133 and ceramic body 131 can be connected to separate voltage sources. In the embodiment shown in FIG. 1, ceramic body 131 is connected to voltage supply 105. A switching unit 138 is provided to allow switching between voltage supply 105 and voltage supply 136. It is thus possible to connect electrode 133 with voltage supply 105 and temporarily with voltage supply 136. As will be described later in detail, voltage supply 136 is used for switching electrode 133. In further embodiments, for example as shown in FIG. 3, electrode 133 is connected to a voltage supply 136 which can be switchable.

According to an embodiment, shielding member 130 does not include an electrode 133. Conductive ceramic 131 can be electrically connected either directly to voltage supply 105 or to voltage supply 136 which connects voltage supply 105 with ceramic body 131. FIG. 3 illustrates an embodiment with voltage supply 136 connecting voltage supply 105 with ceramic body 131.

According to an embodiment, shielding member 130 includes an electrode 133 arranged on the conductive ceramic body 131. Ceramic body 131 can be electrically connected through electrode 133, which is in electrical connection with ceramic body 131, either directly to voltage supply 105 or to voltage supply 136. Only one connection terminal is needed in this case to connect electrode and ceramic body to respective voltage supplies.

According to an embodiment, ceramic body 131 and electrode 133 are separately connected to different voltage supplies.

According to an embodiment, electrode 133 is insulated from ceramic body 131. This allows providing ceramic body 131 and electrode with independent DC voltage supplies.

The electron beam apparatus 100 can be, for example, a focused electron beam apparatus. Electron beam apparatus 100 includes at least one emitter 110 for emitting charged particles. Emitter 110 can be an emitter adapted to emit electrons. An example is a thermal field emitter which allows emission of a bright electron beam from a small emitter area. The electron beam apparatus 100 furthermore includes a column 120 for guiding the charged particles emitted from the emitter 110. The charged particles, which are electrons in embodiments described herein, are accelerated and pass the column 120 at comparably high energy. The high energy allows reduction of electron-electron interaction and thus reduces unwanted aberrations error. A stage 140 is arranged downstream of column 120 which is below the column 120 in FIG. 1. Hence, the column 120 is arranged between the stage 140 and the emitter 110. The stage 140 is adapted to hold a specimen 141.

The shielding member 130 is arranged between the stage 140 and the column 120. Shielding member 130 is positioned to allow charged particles guided through the column 120 to pass through the through hole 132 and to reach specimen 141 held by stage 140. According to an embodiment, shielding member 130 is arranged such that the through hole 132 is aligned with the optical axis of the electron beam apparatus. The optical axis is defined by the column 120. The electrode 133 of shielding member 130 can be connected with voltage supply 136 supplying a switching voltage $V_{SE}$ through switching unit 138. Switching unit 138 allows switching between direct connection to voltage supply 105 supplying bias voltage $V_{bias}$ and a connection through voltage supply 136. Temporal connection to voltage supply 136 for modulating the voltage provided by voltage supply 105 is thus possible to switch electrode 133. Short switching of electrode 133 does not significantly change the electrical potential of ceramic body 131. Shielding member 130 including its electrode 133 can be electrically insulated from column 120. In further embodiments, shielding member 130 can be in electrical contact with column 120.

FIG. 1 further illustrates that electron beam apparatus 100 includes a housing 101 and an objective lens 150. Objective lens 150 can be considered as part of column 120.

Electron emitter 110 includes an emitter tip 111 opposite to an extraction electrode 112, which is positively biased (in case of electrons) to an extraction voltage $V_{ex}$. In order to provide the extraction voltage, power supply 104 is connected to the extraction electrode 112. Extraction electrode 112 is connected with the power supply 102 for providing the acceleration voltage $V_{acc}$, which can typically be connected to ground 103. Thus, the acceleration voltage $V_{acc}$ determines the beam energy of electrons which are travelling in regions of the electron beam device 100 which are on ground potential or when hitting a grounded target.

According to some examples, as shown in FIG. 1, the landing energy of electrons, which are emitted by the emitter 110, on the specimen 141 placed on stage 140 can be defined by biasing the specimen 141. For example, a voltage supply 105 can be connected to the stage 140 to bias the stage 140 against the acceleration potential or the acceleration voltage $V_{acc}$ provided by voltage supply 102. Since specimen 141 is placed on stage 140, specimen 141 will be on the same potential as stage 140. Therefore, by adjusting $V_{bias}$ of voltage supply 105, the landing energy of the electron beam can be adjusted. According to yet further options, which can be used for embodiments of the invention described herein, the beam energy within the charged particle beam device can further be varied, typically increased, by applying a voltage $V_{col}$ to internal beam guiding components 121 of column 120 of the charged particle beam device 100. Accordingly, a power supply 108 can be connected to ground and the beam guiding components 121.

Due to the acceleration voltage $V_{acc}$ and the extraction voltage $V_{ex}$, an electron beam is emitted by the emitter 110 and guided along the optical axis within column 120 of the charged particle beam device 100. The charged particle beam, which is an electron beam in this embodiment, can then be focused by condenser lens 122 and objective lens 150 to be focused on the specimen 141. Typically, the objective lens 150 includes upper and lower pole pieces 156 and a coil 154. The landing energy of the electron beam on the specimen 141 can be adjusted by the power supply 105, which defines the potential difference between the emitter tip 111 and the specimen 141.

On impingement of the primary electron beam, which is emitted from the emitter tip 111, secondary and/or backscattered particles are generated which can be detected by detector 125. In order to provide an image of a region of the specimen, scanning devices (not shown in FIG. 1) can be provided to scan the electron beam over the desired region of the specimen.

The operation of the charged particle beam apparatus will be subsequently explained with reference to an electron beam apparatus to facilitate understanding of the invention. The electrons are for example accelerated with intermediate acceleration velocity of about 30 keV with respect to ground. The acceleration velocity can be expressed in terms of the kinetic energy of the electrons which in turn is related to the acceleration voltage. The electrons run through the column 120 at this high energy and are slowed down to a desired landing energy of e.g. 1 keV. Typically, the specimen such as a wafer is therefore biased on −29 kV with respect to ground by connecting the stage 140 with voltage supply 105.

Between column 120 and specimen 141, a high potential difference occurs which is in the above example about −29 kV. A skilled person will appreciate that other acceleration voltages and landing voltages can be used according to circumstances. Since column 120 and specimen 141 are comparably closely spaced from each other, arcing may occur.

Protection against arcing is provided by shielding member 130 which is substantially on the same electrical potential as stage 140. As illustrated in FIG. 1, shielding member 130 can also be directly connected to voltage supply 105 for example through electrode 133. The electrons decelerated by bias voltage $V_{bias}$ can pass the through hole 132 to strike specimen 141. Furthermore, backscattered or secondary electrons can pass through the trough hole 132 to reach detector 125.

Due to action of shielding member 130, the electric field is now confined to the distance between the shielding member 130 and the column 120. The distance between shielding member 130 and the column 120 is in embodiments described herein comparably small to enable the electron beam apparatus to work with short working distances, which enables small spot sizes.

Although the specimen 141 is protected by shielding member 130 against arcing, arcing between shielding member 130 and column 120 may occur. If arcing occurs, the shielding member 130 may change its electrical potential and potentially reaches ground potential so that specimen 130 is exposed to a high electrical field. However, due to the ceramic material used for shielding member 130, the power at which arcing may occur is not so high in comparison to metal shielding members. The ceramic body 131 of shielding member 130 has a medium conductivity. This means that the ceramic material, although conductive, exhibit a specific resistivity which is significantly higher than the specific resistivity of a metal. During arcing, the current which can flow through the ceramic shielding member 130 is therefore reduced or limited so that the shielding member 130 cannot be completely charged or discharged quickly unlike a massive metal plate. Due to the limited current, shielding member 130 may not be completely charged so that the power, which is released by the ceramic shielding member 130 during arcing, is reduced. Even when arcing between the column 120 and the shielding member 130 is long enough to allow complete charging of the shielding member 130, the arcing between shielding member 130 and the specimen 141 is not as powerful as in the case of a metal plate since the inherent specific resistivity of the ceramic body 131 limits the discharging current between the shielding member 130 and the specimen 141. Hence, potential arcing between charged shielding member 130 and specimen 141 occurs with significantly reduced power which is less harmful to specimen 141. Arcing may even be suppressed altogether, if the power for initiation of an arc is not reached anymore.

According to embodiments, which can be combined with other embodiments described herein, the ceramic body 131 is comprised of a ceramic material having a specific electrical resistivity from about $10^6$ Ωcm to about $10^{12}$ Ωcm. In further embodiments, the ceramic material has a specific electrical resistivity from about $10^7$ Ωcm to about $10^{11}$ Ωcm. In yet further embodiments, the ceramic material has a specific electrical resistivity from about $10^6$ Ωcm to about $10^{11}$ Ωcm. In further embodiments, the ceramic material has a specific electrical resistivity from about $10^7$ Ωcm to about $10^{12}$ Ωcm. In typical examples, ceramic material has a specific electrical resistivity of about $10^8$ Ωcm. The above ranges have been shown to be suitable to reduce the arcing power or even to avoid arcing.

The specific electrical resistivity, or the equivalent specific electrical conductivity, of the ceramic material can also be selected in view of other parameters. For example, the conductivity should be sufficiently high to avoid charging of the ceramic body by stray electrons. The stray current formed by stray electrons can be estimated and thus the needed conductivity chosen.

According to embodiments, which can be combined with other embodiments described herein, the ceramic body 131 is comprised of SiC. The specific resistance of SiC can be tailored. Furthermore, SiC is very durable and can be provided in grades sufficient for the semiconductor industry. Another option is doped aluminum oxide. In further embodiments, a non-ceramic substrate 131 having the above described specific electrical resistivity ranges can be alternatively used. For example, a substrate comprised of a conductive synthetic material can be used. The specific electrical resistivity, or the conductivity, can be, for example, adjusted by the amount of added carbon.

According to embodiments, which can be combined with other embodiments described herein, the ceramic body 131 has a thickness from about 0.5 mm to about 5 mm, particularly from about 1.5 mm to about 2.5 mm.

In addition to protection against arcing, shielding member 130 also allows discharging of specimen 141 caused by generation of multiple secondary electrons. The primary beam may cause generation of more than one secondary electron per primary electron. This causes the specimen 141, for example a wafer, to be charged positively. A positively charged specimen 141, however, may deteriorate image quality and resolution. To discharge the specimen 141, the electrical field above specimen 141 is made negative, so that secondary electrons are bent back to the specimen. Electrode 133 is provided for discharging specimen 141. To avoid loss of measurement time, discharging is typically done during retrace of the electron beam. However, this means that switching has to be done very fast.

Electrode 133 has a small capacity in comparison to the ceramic body 131 of shielding member 130. Furthermore, electrode 133 has a lower specific resistivity than ceramic body 131. This provides for a fast switching of electrode 133, which can also be referred to as switching electrode. Electrode 133 is positioned around the through hole 132 through which the primary beam impinges on specimen 141. According to embodiments, electrode 133 is centered very well around through hole 132 to avoid beam diameter degradation during imaging. Furthermore, electrode 133 is typically also centered to objective lens 150 and/or pole pieces 156 of objective lens 150.

Electrode 133 can be connected to a voltage supply adapted to provide a voltage suitable to discharge specimen 141. Such a voltage supply is, for example, shown in FIGS. 1 and 6B. This voltage supply is temporarily switched on to make electrode 133 negative with respect to specimen 141 so that secondary electrons are diverted to the specimen 141 to compensate the positive charges left due to multiple secondary electron generation.

According to embodiments, which can be combined with other embodiments described herein, electrode 133 is comprised of a metal, metal alloy or other highly conductive metal compounds. According to embodiments, which can be combined with other embodiments described herein, electrode 133 is comprised of metal covering a portion of the ceramic body 131.

Since electrode 133 has a lower specific resistivity than ceramic body 131, electrode 133 can be switched with high frequency. To increase switching speed, the capacity of electrode 133 can be made small by reducing the area covered by electrode 133. Furthermore, connection lines 134 for connecting the electrode 133 with the voltage supply can be designed to have a small capacity.

The conductive ceramic body 131 also inherently forms an RC-member with the electrode 133. The resistance is formed by the ceramic material. Due to the comparably high specific resistivity of the ceramic material, fast switching of the electrode 133 does not lead to a significant change of the charge stored in the ceramic body 131. This means that the switching signal is only little effected by the ceramic body 131.

According to embodiments, which can be combined with other embodiments described herein, the electrode 133 is formed around the through hole 132 on opposite sides of the ceramic body 131 and extends on sidewalls of the through hole 132. The electrical connection of electrode 133 is provided by one or more connection lines 134 which are typically formed on the side of ceramic body 131 facing the column 120. It is also possible to form the connection line 134 on the side facing the stage 140. Since electrode 133 faces specimen 141 for redirecting secondary electrons, electrical connection between upper side, which is the side facing column 120, and lower side, which is the side facing stage 140, is provided by forming electrode 133 through the through hole 132. Portions of electrode 133 can also be formed on the upper side and centered around through hole 132. Details of such an arrangement are illustrated in FIGS. 2A and 2B.

According to embodiments, which can be combined with other embodiments described herein, electrode 133 is in electrical connection with the ceramic body 131. Electrode 133 including its electrical connection line 134 can be formed directly on the ceramic body 134. Therefore, only one electrical terminal is needed to connect both the electrode 133 and the ceramic body 131. Typically, electrode 133 is connected through connection line 134 with a terminal formed on ceramic body 131. Since connection line 134 and electrode 133 are in electrical contact with ceramic body 131, ceramic body will also be on the same electrical potential as electrode 133. The direct electrical connection between electrode 133 and ceramic body 131 does not significantly influence switching behavior of the electrode 133 since ceramic body 131 has a significantly higher resistivity than electrode 133. Hence, fast switching of electrode 133 does not affect the electrical potential of ceramic body 131 which will be substantially constant. This also means that the protecting effect of shielding member 130 remains effective during switching of the electrode 133.

Figure 6A:
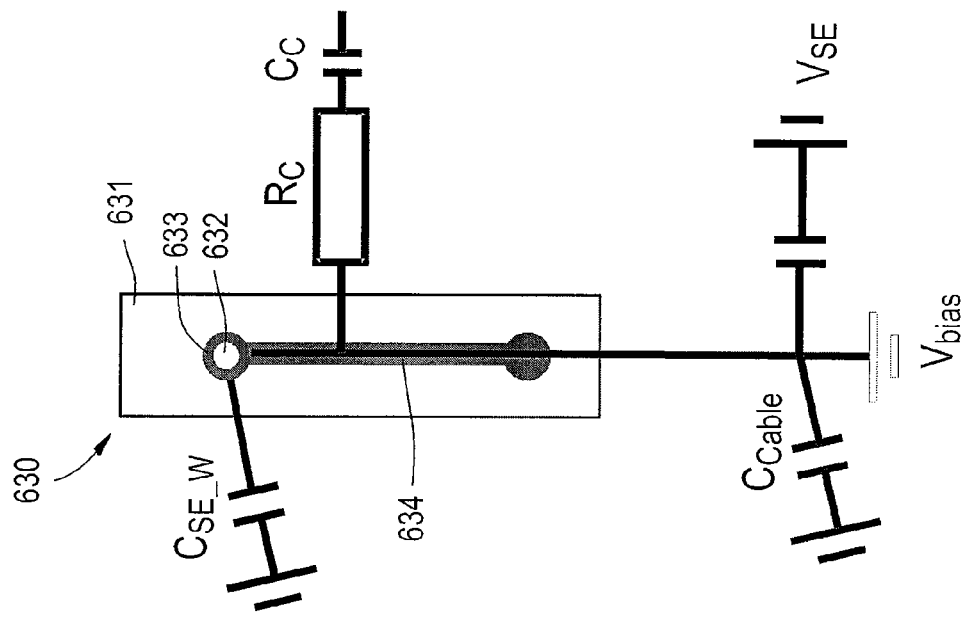
FIGS. 6A and 6B illustrates schematic views of a shielding member according to embodiments described herein.
Figure 6B:
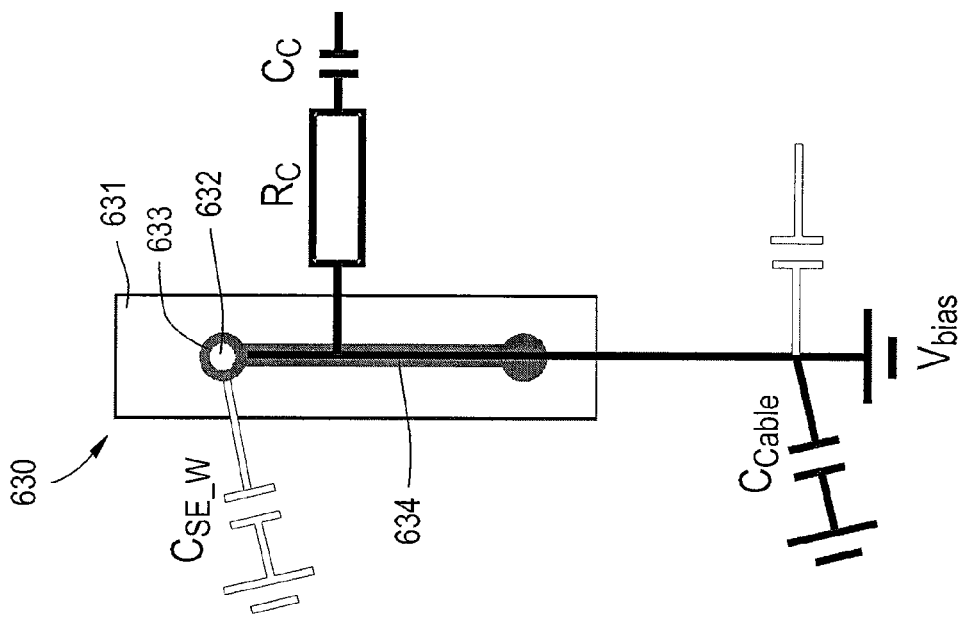

The above described low-pass capability of ceramic body 131 can be understood when considering the ceramic body as a large capacity which is connected to electrode 133 through a large resistor formed by the conductive ceramic material of ceramic body 131. An equivalent circuit is illustrated in FIGS. 6A and 6B which will be described further below.

Electrode 133 can also be referred to as charge control electrode which is particularly suitable for scanning electron microscopes.

FIG. 2A illustrates an embodiment of a shielding member 230 having a ceramic body 231, a through hole 232, an electrode 233, a terminal 235 and a connection line 234, which electrically connects terminal 235 with electrode 233. As illustrated in FIG. 2A, electrode 233 can be formed on both sides of ceramic body 231. Furthermore, electrode 233 is axially centered around through hole 232. Typically, electrode 233 has a rotationally-symmetric shape with respect to the axis of through hole 232.

Electrode 233 extends through the through hole 232 and covers the sidewalls of through hole 232. Electrode 233 and connection line 234 are formed by a metal which is deposited directly onto ceramic body 231 so that they are in electrical contact. According to embodiments, electrical connection line 234 can also be partially or completely electrically insulated from ceramic body 231. This reduces the contact area and increases the resistance between electrode 233 and ceramic body 231. By so doing, the low-pass characteristic of the ceramic body is improved. The contact area between electrode 233 and electrical connection line 234 and ceramic body 231 can be adapted to tailor the electrical behavior of shielding member 230.

Shielding member 230 is furthermore adapted to be held by holders which keeps shielding member 230 in a predefined position with respect to the column. The holders also electrically insulate the shielding member 230 against the column. The holders can be, for example, fixed to the shielding members 230 by a screw joint, wherein the holders a screwed in an internal thread 236.

An example of such an arrangement is illustrated in FIG. 3. FIG. 3 illustrates a holder 160 according to embodiments which can be combined with other embodiments described herein. Holder 160 includes an insulating body.

As illustrated in FIG. 3, electron beam apparatus 100 includes a column 120 having an objective lens 150. Holders 160 position and maintain shielding member 130 in a predefined distance from the front end of column 120 and objective lens 150 so that shielding member 130 is electrically insulated from column 120 and objective lens 150.

Referring back to FIG. 2A, shielding member 230 can be manufactured, for example by providing a conductive ceramic body 231 and forming the through hole 232 in the ceramic body 231 so that the through hole 232 extends through the ceramic body 231. Through hole 232 can be formed when ceramic body 231 is provided as green body. Before or after firing the green ceramic body, electrode 233 surrounding the through hole 232 and connection line 234 in electrical connection with the electrode 233 are formed. The material of electrode 232 is chosen to have a lower specific electrical resistivity than the fired ceramic body 231. Electrode 233 and connection line 234 can be a metal coating.

According to an embodiment, electrode 233 and/or connection line 234 can be formed by vapor deposition. According to an embodiment, electrode 233 can be a metal ring or a preformed metal electrode which is inserted into through hole 232. In this case, through hole 232 in ceramic body 131 can be made larger, for example up to 20 mm, to provide sufficient space for the metal ring. The actual through hole for the charged particles are than defined by the aperture of the ring.

According to an embodiment, which can be combined with other embodiments described herein, a shielding member 300, as illustrated in FIG. 2B, includes a carrier 335 comprised of an insulating material and a conductive substrate 331 which at least partially covers portions of carrier 335. Conductive substrate 331 can be comprised of a material having a specific electrical resistivity in a range from about $10^6$ Ωcm to about $10^{12}$ Ωcm. Examples are conductive ceramics such as SiC and doped aluminum oxide and diamond-like carbon (DLC). Carrier 335 is electrically insulating. A through hole 332 is provided in the conductive substrate 331 and carrier 335. Substrate 331 can be formed on carrier 335, for example, by deposition or pasting.

According to an embodiment, shielding member 300 includes an electrode 333 which can be comprised of, for example, metal. An electrical connection 334 can be provided to contact electrode 333 and conductive substrate 331.

Figure 2C:
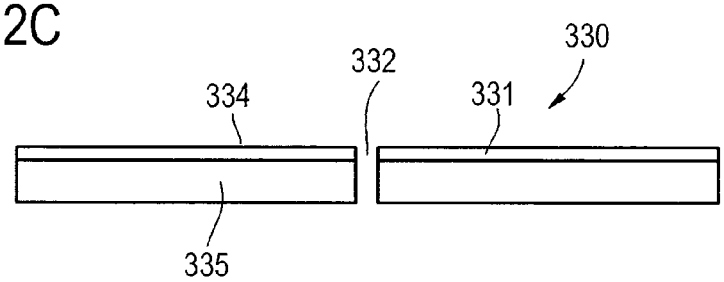
FIG. 2C illustrates a schematic view of a shielding member according to embodiments described herein.

According to an embodiment, as illustrated in FIG. 2C, shielding member 300 does not include a separate electrode.

FIG. 4 illustrates a further embodiment, which can be combined with other embodiments described herein. Charged particle beam apparatus 400 includes multiple columns 420 and shielding members 430. One shielding member 430 is assigned to a respective column 420 so that the through hole 432 of each shielding member 430 is aligned with the optical axis of the respective column 420. Each column 420 includes an emitter 410 and an objective lens 450 as described above.

In further embodiments, charged particle beam apparatus can include a single column with multiple emitters adapted to generate separate charged particle beams. It is therefore possible to provide a module having a plurality of column, wherein each column includes one emitter, or a module having at least one column which includes a plurality of emitters for generating separate charged particle beams.

Shielding members 430 can be designed as described in connection with FIGS. 2A to 2C and can include a ceramic body 431 and an electrode 433. As illustrated in FIG. 4, adjacent shielding members 430 are laterally spaced from each other so that they are electrically insulated from each other. This allows individual switching of electrodes 433. Furthermore, the capacity of the shielding members 430 is limited to the capacity of an individual shielding member which is beneficial in case of arcing. If arcing occurs between one column 420 and a shielding member 430 assigned to this column 420, other shielding members 430 remain unaffected. Furthermore, due to the reduced capacity, the stored energy is reduced which reduces the power of a possible arcing even further.

Each shielding member 430, particularly the electrode 433 of each shielding member 430, can be connected to separate voltage supplies 436a, 436b and 436c, respectively. It would also be possible to connect the electrodes 433 with a switching unit which allows selective temporal connection of an electrode with a voltage supply.

Figure 5A:
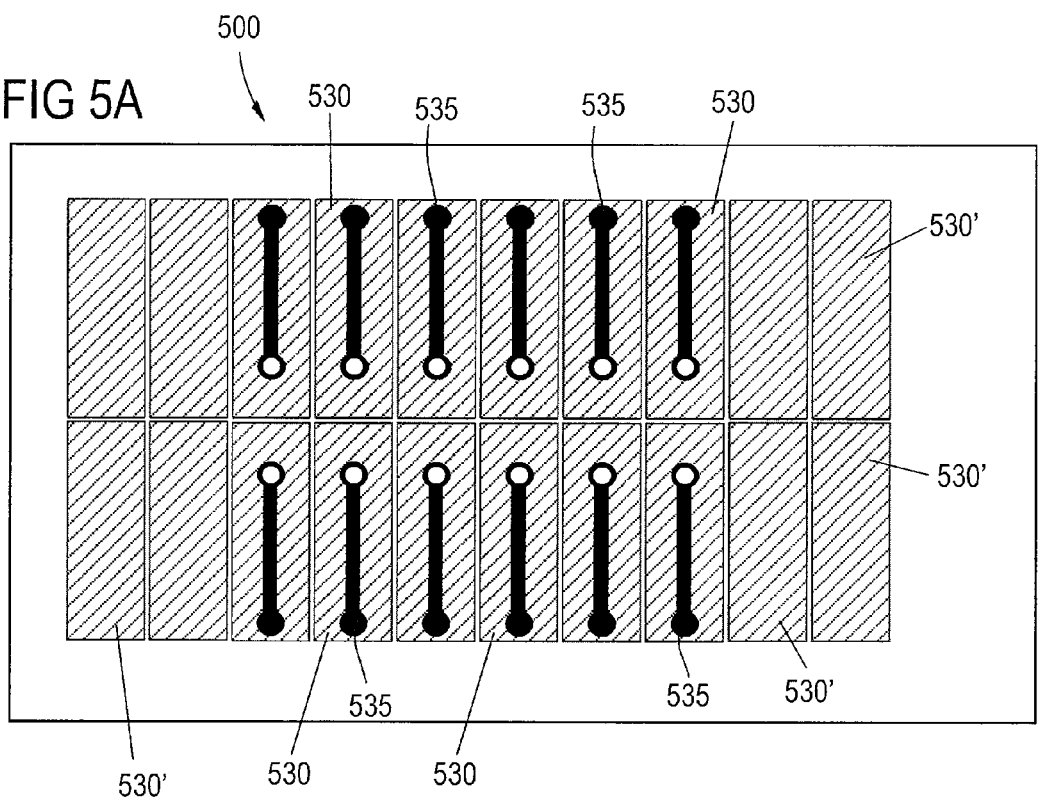
FIGS. 5A and 5B illustrate schematic views of a shielding apparatus according to embodiments described herein.
Figure 5B:
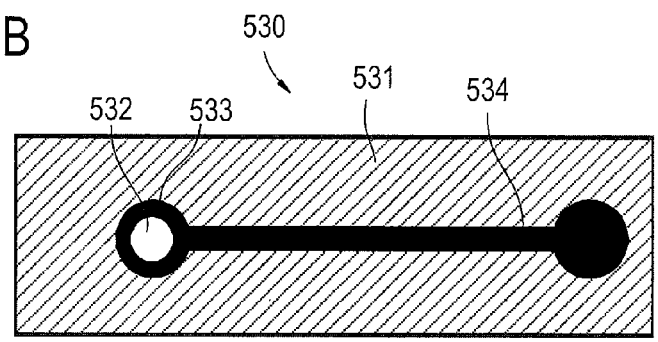

FIGS. 5A and 5B illustrate a shielding apparatus according to an embodiment which can be combined with other embodiments described herein. Shielding apparatus 500 includes a plurality of individual shielding members 530, one of them is illustrated in an enlarged view in FIG. 5B. Each shielding member 530 can be designed as described in connection with FIGS. 2A to 2C.

The shielding members 530 are arranged in two rows in this embodiment so that the connection lines 534 are arranged parallel to each other. The sides on which the through holes 532 are formed are positioned towards each other as illustrated in FIG. 5A. A skilled person will appreciate that other arrangements are also possible. Each shielding member 530 can be positioned and aligned individually with respect to the respective column of a multi-column charged particle beam apparatus. An example is illustrated in FIG. 4. Each shielding member 530, particularly the through hole 532 of each shielding member 530, is centered and aligned with respect to the respectively assigned column so that for each column an individual shielding member 530 is provided.

In further embodiments, shielding members 530 can be arranged in one row, three or more rows. In yet other embodiments, four shielding members 530 can be provided with terminals extending to all sides of the shielding apparatus.

Each shielding member 530 includes a ceramic body 531, for example as described above. Since the main component of shielding member 530 is the ceramic body 531, shielding member 530 can also be referred to as ceramic tile. The thickness of ceramic body 531 can be about 1 mm. The spacing between adjacent shielding members 530 can be about 1 mm. A skilled person will appreciate that these values are only exemplary values and that the dimensions of ceramic body 531 can be adapted according to specific needs.

The ceramic body 531 can be comprised of, for example SiC. Other conductive ceramic materials can also be used. Electrode 533 including connection line 534 can be a metal coating which are directly formed on ceramic body 531 to be in electrical contact with ceramic body 531. For example, Ti can be used as metal for forming electrode 533 and connection line 534.

A terminal in electrical connection with connection line 534 can be arranged on the side of ceramic body 531 which faces the column. Connection lines 534 can be formed on the side facing the stage. This situation is illustrated in FIGS. 5A and 5B. Terminals are provided to connect the electrodes 533 of each shielding member 530 with a voltage supply. Each electrode 533 and hence each shielding member 530 can be individually connected. This allows for individually switching of the electrodes 533 independently of the other electrodes 533. Each electrode 533 can therefore be connected with a separate voltage supply. According to embodiments, which can be combined with other embodiments described herein, each electrode 533 is connected to a common voltage supply through a switching unit which is adapted to individually and independently connect the electrodes 533 with the voltage supply. The voltage supply is adapted to provide a switching voltage $V_{SE}$ for discharging the specimen as described above.

Shielding apparatus 500 can also include dummy shielding members 530' which are electrically connected to any voltage supply supplying the bias voltage $V_{bias}$ but which do not include electrodes unlike shielding members 530 to protect the sample from arcing from the outer areas of the column or columns set up FIGS. 6A and 6B illustrates equivalent circuits of a shielding member according to an embodiment to explain its function. The parameters given below are only exemplary values and shall not be considered as limiting the invention.

FIG. 6A illustrates the static situation when electrode 633 is connected to voltage supply which supplies bias voltage $V_{bias}$ to bias shielding member 630. Elements which are not electrically connected are indicated in light grey. $V_{bias}$ can be, for example, 50 kV and is supplied though terminal and connection line 634. The resistance $R_C$ of the ceramic body 631 can be about 1 MΩ while the capacity $C_C$ of the ceramic body 631 can be about 200 pF. The specific resistivity of the ceramic body 631 can be about $1 \ast 10^8$ Ωcm. The capacity $C_{Cable}$ of connectors and cables should also be considered which can be about 100 pF.

On the assumption of these values, ceramic body 631 can be charged within about 2 ms (1 MΩ×200 pF=2 ms). Switching of electrode 633 should be shorter than this time since otherwise ceramic body 631 will also change its charge. The dynamic situation is illustrated in FIG. 6B.

When switching electrode 633, capacity $C_{SE\_W}$ between electrode 633 (switching electrode) and specimen (wafer) should be considered as well. $C_{SE\_W}$ can be as small as about 3 pF. For switching, electrode 633 is temporarily disconnected from $V_{bias}$ and connected with a voltage supply providing voltage $V_{SE}$ for a short duration. Alternatively, $V_{SE}$ can be superimposed on $V_{bias}$. $V_{SE}$ can be about ±50 V to about ±1000 V, for example. Switching frequency can be comparably high, for example 1 MHz. On the assumption of a switching voltage $V_{SE}$ with amplitude of about 1000 V, a switching power of about 1300 W can be estimated. This power is consumed due the charging and discharging of electrode 633 with a frequency of 1 MHz. At the same time, power dissipation caused by the ceramic body 631 which is in electrical contact with electrode 633 is only about 1 W which is negligible.

When assuming that switching occurs with a switching voltage $V_{SE}$ with amplitude of about 400 V with the other parameters remaining the same, the switching power is about 200 W while the dissipation power dissipation caused by ceramic body 631 is only about 0.16 W.

The switching power can be estimated using the following relation:

Switching Power=$2 \times V_{SE}^2 \times 2\pi \times f_S \times (C_{SE\_W} + C_{Cable})$ with $f_S$ being the switching frequency. Power dissipation can be calculated using the following estimation:

$$\text{Power Dissipation} = \frac{V_{SE}^2}{R_C}.$$

The above estimations demonstrate that low-capacitance high-speed switching of highly conductive electrode 633 and connection line 634, although in electrical contact with conductive ceramic body 631, is possible without large energy dissipation. This also means that electrode 633 can be switched very fast while keeping ceramic body 631 substantially on a constant electrical potential. The electrical field above specimen can therefore be switched rapidly.

According to an embodiment, the charged particle beam apparatus can therefore be operated by placing a specimen on the stage of the charged particle beam apparatus and emitting a charged particle beam from an emitter of the charged particle beam apparatus. The charged particle beam is guided through the column of the charged particle beam apparatus. The shielding member arranged between the specimen and the column is biased to retard the charged particles passing the column. Specimen can also be biased through contact with the stage. The electrode of the shielding member is repeatedly switched to change the electrical field above the specimen to cause secondary electrons to redirect back to specimen for discharging.

The above described embodiments provide for a low-capacity fast switching electrode with low dissipation power. This allows fast changing of the electrical field above the specimen without losing the protective nature of the shielding member. Furthermore, due the specific resistivity of the conductive ceramic used as material for the shielding member, the risk of high power arcing between the shielding member and the specimen is greatly reduced even if arcing between the column and the shielding member occurs. The comparably high resistivity of the conductive ceramic effectively limits the discharging current during arcing and thus reduces the power of such arcing which minimizes any damaging effect. Furthermore, the conductive ceramics serves as low pass filter and reduces thus the apparent capacity of the electrode serving as switching electrode. When using the shielding members for multi-column apparatuses, multiple shielding members are used which are electrically insulated from each other. Using individual shielding members facilitates alignment with the respective column and further reduces the capacitance.

It is to be understood that even though examples of potentials are described herein, embodiments of the invention are also directed to examples where other potentials are used as long as the relative potentials of the components, i.e. the potential differences or voltages, are within the described ranges.

The embodiments described herein, may as well include additional components (not shown) such as condenser lenses, deflectors of the electrostatic, magnetic or compound electrostatic-magnetic type, such as Wien filters, scanning deflectors of the electrostatic, magnetic or compound electrostatic-magnetic type, stigmators of the electrostatic, magnetic or compound electrostatic-magnetic type, further lenses of the electrostatic, magnetic or compound electrostatic-magnetic type, and/or other optical components for influencing and/or correcting the beam of primary and/or secondary charged particles, such as deflectors or apertures. Indeed, for illustration purposes, some of those components are shown in the figures described herein. It is to be understood that one or more of such components can also be applied in embodiments of the invention.

According to an embodiment, which can be combined with embodiments described herein, a shielding member for a charged particle beam apparatus includes a conductive ceramic body; a through hole extending through the ceramic body; an electrode surrounding the through hole; and an electrical connection for connecting the electrode with a voltage supply, wherein the electrode has a lower specific electrical resistivity than the ceramic body.

According to an embodiment, which can be combined with embodiments described herein, the ceramic body is comprised of a ceramic material having a specific electrical resistivity from about $10^6$ Ωcm to about $10^{12}$ Ωcm.

According to an embodiment, which can be combined with embodiments described herein, the electrode is comprised of metal covering a portion of the ceramic body.

According to an embodiment, which can be combined with embodiments described herein, the electrode is in electrical connection with the ceramic body.

According to an embodiment, which can be combined with embodiments described herein, the ceramic body has a thickness from about 0.5 mm to about 5 mm, and particularly from about 1.5 mm to about 2.5 mm.

According to an embodiment, which can be combined with embodiments described herein, the through hole has a diameter from about 0.5 mm to about 10 mm, and particularly between about 1 mm and about 5 mm.

According to an embodiment, which can be combined with embodiments described herein, the electrode is formed around the through hole on opposite sides of the ceramic body and extends on sidewalls of the through hole.

According to an embodiment, which can be combined with embodiments described herein, a shielding apparatus for a charged particle beam apparatus includes a plurality of shielding members, wherein each shielding member is insulated from adjacent shielding members and includes a separate electrical connection for connecting the electrode with a respective voltage supply.

According to an embodiment, which can be combined with embodiments described herein, a charged particle beam apparatus, particularly a focused charged particle beam apparatus, includes at least one emitter for emitting charged particles; at least one column for guiding the charged particles emitted from the emitter; a stage adapted to hold a specimen, wherein the column is arranged between the stage and the emitter; and at least one shielding member arranged between the stage and the column, wherein the electrode of the shielding member is connected with a voltage supply; wherein the shielding member is positioned to allow charged particles guided through the column to pass through the through hole and to reach a specimen held by the stage and wherein the shielding member is electrically insulated from the column.

According to an embodiment, which can be combined with embodiments described herein, the charged particle beam apparatus includes a plurality of emitters, a plurality of columns and a shielding apparatus.

According to an embodiment, which can be combined with embodiments described herein, a respective shielding member is assigned to a respective column, wherein each shielding member has a separate electrical connection for connecting the conductive member with a respective voltage supply.

According to an embodiment, which can be combined with embodiments described herein, each voltage supply is switchable.

According to an embodiment, which can be combined with embodiments described herein, the shielding member includes a conductive substrate comprised of a material having a specific electrical resistivity in a range from about $10^6$ Ωcm to about $10^{12}$ Ωcm; and a through hole extending through the conductive substrate.

According to an embodiment, which can be combined with embodiments described herein, the shielding member includes a carrier comprised of an insulating material which is at least partially covered by a conductive substrate, wherein the carrier includes a through hole which is coaxial with the through hole of the conductive substrate.

According to an embodiment, which can be combined with embodiments described herein, a charged particle beam apparatus includes a plurality of emitters for generating separate charged particle beams and a plurality of shielding members, wherein a respective shielding member is assigned to a respective emitter, and wherein each shielding member includes a separate electrical connection for connecting the conductive substrate with a voltage supply.

According to an embodiment, which can be combined with embodiments described herein, the shielding members are electrically insulated from each other.

According to an even further embodiment, a method of manufacturing a shielding member is provided. The method includes providing a conductive ceramic body; forming a through hole in the ceramic body so that the through hole extends through the ceramic body; and forming an electrical connection of the conductive ceramic body.

According to an embodiment, which can be combined with embodiments described herein, a method of manufacturing a shielding member includes providing a conductive ceramic body; forming a through hole in the ceramic body so that the through hole extends through the ceramic body; forming an electrode surrounding the through hole and an electrical connection in electrical connection with the electrode, wherein the electrode has a lower specific electrical resistivity than the ceramic body.

According to an embodiment, which can be combined with embodiments described herein, a method of operating a charged particle beam apparatus includes providing a charged particle beam apparatus; placing a specimen on the stage; emitting a charged particle beam from the emitter and guiding the emitted charged particle beam through the column; biasing the shielding member to retard the charged particles passing the column; and repeatedly switching the electrode of the shielding member.

While the foregoing is directed to embodiments of the invention, other and further embodiments of the invention may be devised without departing from the basic scope thereof, and the scope thereof is determined by the claims that follow.

The invention claimed is:

1. A shielding member for preventing arcing between a stage and a column of a charged particle beam apparatus, comprising:
a conductive substrate comprised of a material having a specific electrical resistivity in a range from about $10^6$ Ωcm to about $10^{12}$ Ωcm; and
a through hole extending through the conductive substrate.

2. The shielding member according to claim 1, further comprising a conductive ceramic body, the conductive ceramic body forming the conductive substrate.

3. The shielding member according to claim 1, further comprising
an electrode surrounding the through hole; and
an electrical connection for connecting the electrode with a voltage supply, the electrode comprising a lower specific electrical resistivity than the conductive substrate.

4. The shielding member according to claim 3, wherein the electrode is comprised of metal covering a portion of the conductive substrate.

5. The shielding member according to claim 3, wherein the electrode is in electrical connection with the conductive substrate.

6. The shielding member according to claim 1, wherein the conductive substrate comprises a thickness from about 0.5 mm to about 5 mm.

7. The shielding member according to claim 1, wherein the through hole comprises a diameter from about 0.5 mm to about 10 mm.

8. The shielding member according to claim 3, wherein the electrode is formed around the through hole on opposite sides of the conductive substrate and extends on sidewalls of the through hole.

9. The shielding member according to claim 1, further comprising a carrier comprised of an insulating material which is at least partially covered by the conductive substrate, the carrier comprises a through hole which is coaxial with the through hole of the conductive substrate.

10. A shielding apparatus for preventing arcing between a stage and columns of a charged particle beam apparatus, comprising:
a plurality of shielding members, each shielding member comprising a conductive substrate comprised of a material having a specific electrical resistivity in a range from about $10^6$ Ωcm to about $10^{12}$ Ωcm, and a through hole extending through the conductive substrate,
wherein each shielding member is insulated from adjacent shielding members and comprises a separate electrical connection for connecting the conductive substrate with a voltage supply.

11. The shielding apparatus according to claim 10, wherein each shielding member comprises a conductive ceramic body forming the conductive substrate.

12. The shielding member according to claim 10, wherein each shielding member further comprises
an electrode surrounding the through hole; and
an electrical connection for connecting the electrode with a voltage supply, the electrode comprising a lower specific electrical resistivity than the conductive substrate.

13. Charged particle beam apparatus, particularly a focused charged particle beam apparatus, comprising:
at least one emitter for emitting charged particles;
at least one column for guiding the charged particles emitted from the emitter;
a stage for holding a specimen, the column being arranged between the stage and the emitter; and
at least one shielding member arranged between the stage and the column for preventing arcing between the stage and the column, the at least one shielding member comprising a conductive substrate comprised of a material having a specific electrical resistivity in a range from about $10^6$ Ωcm to about $10^{12}$ Ωcm, and a through hole extending through the conductive substrate, the conductive substrate of the shielding member being connected with a voltage supply;
wherein the shielding member is positioned to allow charged particles guided through the column to pass through the through hole and to reach a specimen held by the stage and wherein the shielding member is electrically insulated from the column.

14. The charged particle beam apparatus according to claim 13, wherein the charged particle beam apparatus comprises a plurality of emitters for generating separate charged particle beams and a plurality of shielding members, wherein a respective shielding member is assigned to a respective emitter, and wherein each shielding member comprises a separate electrical connection for connecting the conductive substrate with a respective voltage supply.

15. The charged particle beam apparatus according to claim 13, wherein the charged particle beam apparatus comprises a plurality of emitters for generating separate charged particle beams and a plurality of shielding members, wherein a respective shielding member comprises an electrode surrounding the through hole and is assigned to a respective emitter, and wherein each shielding member comprises a separate electrical connection for connecting at least one of the conductive substrate and the electrode with a respective voltage supply.

16. The charged particle beam apparatus according to claim 15, wherein each voltage supply is switchable.

17. The charged particle beam apparatus according to claim 13, wherein each shielding member is insulated from adjacent shielding members.

18. A method of manufacturing a shielding member for preventing arcing between a stage and a column of a charged particle beam apparatus, comprising:
providing a conductive substrate comprised of a material having a specific electrical resistivity in a range from about $10^6$ Ωcm to about $10^{12}$ Ωcm; and
forming a through hole in the conductive substrate so that the through hole extends through the conductive substrate.

19. A method of operating a charged particle beam apparatus, comprising:
  providing a charged particle beam apparatus, the charged particle beam apparatus comprising
    at least one emitter for emitting charged particles;
    at least one column for guiding the charged particles emitted from the emitter;
    a stage for holding a specimen, wherein the column is arranged between the stage and the emitter; and
    at least one shielding member arranged between the stage and the column for preventing arcing between the stage and the column, the at least one shielding member comprising a conductive substrate comprised of a material having a specific electrical resistivity in a range from about $10^6$ Ωcm to about $10^{12}$ Ωcm, a through hole extending through the conductive substrate, and an electrode surrounding the through hole;
    wherein the shielding member is positioned to allow charged particles guided through the column to pass through the through hole and to reach a specimen held by the stage, wherein the shielding member is electrically insulated from the column;
  placing a specimen on the stage;
  emitting a charged particle beam from the emitter and guiding the emitted charged particle beam through the column;
  biasing the shielding member to retard the charged particles passing through the column; and
  repeatedly switching the electrode of the shielding member.

20. The method of claim 19, wherein repeatedly switching the electrode of the shielding member comprises temporarily connecting the electrode with a voltage supply.

* * * * *